United States Patent
Kantarovsky et al.

(10) Patent No.: US 11,881,506 B2
(45) Date of Patent: Jan. 23, 2024

(54) GATE STRUCTURES WITH AIR GAP ISOLATION FEATURES

(71) Applicant: GLOBALFOUNDRIES U.S. Inc., Malta, NY (US)

(72) Inventors: Johnatan A. Kantarovsky, South Burlington, VT (US); Mark D. Levy, Williston, VT (US); Brett T. Cucci, Colchester, VT (US); Jeonghyun Hwang, Ithaca, NY (US); Siva P. Adusumilli, South Burlington, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 260 days.

(21) Appl. No.: 17/386,062

(22) Filed: Jul. 27, 2021

(65) Prior Publication Data

US 2023/0037420 A1  Feb. 9, 2023

(51) Int. Cl.

| | |
|---|---|
| *H01L 29/06* | (2006.01) |
| *H01L 29/778* | (2006.01) |
| *H01L 29/66* | (2006.01) |
| *H01L 21/8234* | (2006.01) |

(52) U.S. Cl.
CPC .. *H01L 29/0649* (2013.01); *H01L 21/823481* (2013.01); *H01L 29/66431* (2013.01); *H01L 29/7786* (2013.01)

(58) Field of Classification Search
CPC ....... H01L 21/823481; H01L 29/66431; H01L 29/42316; H01L 29/0649; H01L 29/66462; H01L 29/7786; H01L 29/2003; H01L 29/41766; H01L 21/28587; H01L 29/7787; H01L 29/475; H01L 21/0272; H01L 29/7783; H01L 2/66462

USPC .......... 257/194, 410, 76, E29.246, E29.253, 257/E29.252, E21.407, E29.249, E29.127; 438/590, 270, 191, 595, 674, 694

See application file for complete search history.

(56) References Cited

U.S. PATENT DOCUMENTS

| | | | |
|---|---|---|---|
| 4,710,794 A | 12/1987 | Koshino | |
| 5,358,885 A * | 10/1994 | Oku ................ | H01L 29/42316 |
| | | | 257/E29.127 |
| 5,804,474 A * | 9/1998 | Sakaki ............. | H01L 21/28581 |
| | | | 430/315 |
| 6,406,975 B1 | 7/2002 | Lim et al. | |
| 6,596,598 B1 * | 7/2003 | Krivokapic ....... | H01L 29/66537 |
| | | | 438/653 |

(Continued)

FOREIGN PATENT DOCUMENTS

JP      6056435      1/2017

OTHER PUBLICATIONS

Application and Drawings for U.S. Appl. No. 17/108,543, filed Dec. 1, 2020, 24 pages.

(Continued)

*Primary Examiner* — Mouloucoulaye Inoussa
(74) *Attorney, Agent, or Firm* — Francois Pagette; Andrew M. Calderon; Calderon Safran & Cole P.C.

(57) ABSTRACT

The present disclosure relates to semiconductor structures and, more particularly, to gate structures and methods of manufacture. The structure includes: a gate structure comprising a horizontal portion and a substantially vertical stem portion; and an air gap surrounding the substantially vertical stem portion and having a curved surface under the horizontal portion.

20 Claims, 8 Drawing Sheets

(56) References Cited

U.S. PATENT DOCUMENTS

| | | | |
|---|---|---|---|
| 6,891,235 B1 | 5/2005 | Furukawa et al. | |
| 7,015,116 B1 | 3/2006 | Lo et al. | |
| 7,608,497 B1* | 10/2009 | Milosavljevic | H01L 29/66462 257/E21.205 |
| 7,622,778 B2 | 11/2009 | Lee et al. | |
| 7,851,884 B2 | 12/2010 | Asai et al. | |
| 8,395,217 B1 | 3/2013 | Cheng | |
| 9,029,831 B2 | 5/2015 | Chiu et al. | |
| 9,082,749 B2 | 7/2015 | Taniguchi et al. | |
| 9,368,608 B1 | 6/2016 | Camillo-Castillo | |
| 9,698,245 B2 | 7/2017 | Cheng et al. | |
| 9,917,178 B2 | 3/2018 | Ching et al. | |
| 9,922,973 B1 | 3/2018 | Shank et al. | |
| 9,991,257 B2* | 6/2018 | Park | H01L 29/0649 |
| 10,192,779 B1 | 1/2019 | Shank et al. | |
| 10,224,396 B1 | 3/2019 | Shank et al. | |
| 10,388,728 B1 | 8/2019 | Zierak et al. | |
| 10,446,643 B2 | 10/2019 | Stamper et al. | |
| 10,461,152 B2 | 10/2019 | Adusumilli et al. | |
| 2002/0132448 A1 | 9/2002 | Lim et al. | |
| 2002/0163036 A1* | 11/2002 | Miura | H01L 29/4991 257/E21.205 |
| 2004/0048444 A1 | 3/2004 | Seo | |
| 2004/0063303 A1* | 4/2004 | Behammer | H01L 29/66871 257/E21.453 |
| 2007/0264763 A1* | 11/2007 | Behammer | H01L 29/7786 257/E29.252 |
| 2007/0264781 A1* | 11/2007 | Behammer | H01L 21/28587 257/E29.252 |
| 2008/0087916 A1* | 4/2008 | Amasuga | H01L 29/7787 257/E21.445 |
| 2008/0111199 A1* | 5/2008 | Kim | H01L 29/66833 257/E21.21 |
| 2008/0157121 A1* | 7/2008 | Ohki | H01L 29/66462 257/E21.403 |
| 2009/0014758 A1* | 1/2009 | Nogami | H01L 29/42316 257/280 |
| 2009/0085063 A1* | 4/2009 | Makiyama | H01L 29/7787 257/E29.081 |
| 2010/0276698 A1* | 11/2010 | Moore | H01L 21/28587 257/E29.089 |
| 2010/0314668 A1 | 12/2010 | Oliier | |
| 2011/0018091 A1 | 1/2011 | Barth | |
| 2011/0057272 A1* | 3/2011 | Kurahashi | H01L 29/66462 257/410 |
| 2012/0038024 A1 | 2/2012 | Botula | |
| 2012/0306049 A1 | 12/2012 | Booth, Jr. | |
| 2013/0093006 A1* | 4/2013 | Senda | H01L 29/42316 257/330 |
| 2013/0193531 A1 | 8/2013 | Nishikawa | |
| 2013/0234241 A1* | 9/2013 | Bowers | H01L 29/66734 257/330 |
| 2013/0320459 A1 | 12/2013 | Shue et al. | |
| 2013/0334647 A1* | 12/2013 | Sasaki | H01L 29/68 257/471 |
| 2015/0001671 A1 | 1/2015 | In 'T Zandt | |
| 2015/0340273 A1 | 11/2015 | Jaffe | |
| 2016/0064475 A1 | 3/2016 | Feilchenfeld | |
| 2016/0071925 A1 | 3/2016 | Jaffe | |
| 2017/0263724 A1* | 9/2017 | Kodera | H01L 29/402 |
| 2018/0083128 A1 | 3/2018 | Yokoyama | |
| 2018/0108675 A1 | 4/2018 | Schmidt | |
| 2019/0081138 A1 | 4/2019 | Liu | |
| 2019/0157407 A1 | 5/2019 | Singh | |
| 2019/0229184 A1 | 7/2019 | Shank et al. | |
| 2019/0229185 A1 | 7/2019 | Adusumilli | |
| 2019/0312142 A1 | 10/2019 | Adusumilli | |
| 2020/0144369 A1 | 5/2020 | Lin | |
| 2020/0343127 A1 | 10/2020 | Wann | |
| 2020/0343373 A1 | 10/2020 | Tsai | |
| 2021/0091213 A1 | 3/2021 | Jain | |

OTHER PUBLICATIONS

Chu et al., "Controlled Pulse-Etching with Xenon Difluoride", IEEE, May 1997, 5 pages.

Office Action in U.S. Appl. No. 17/108,543 dated Jan. 20, 2023, 14 pages.

Response to Office Action in U.S. Appl. No. 17/108,543 dated Apr. 19, 2023, 14 pages.

Notice of Allowance in U.S. Appl. No. 17/108,543 dated Jun. 13, 2023, 7 pages.

* cited by examiner

GATE STRUCTURES WITH AIR GAP ISOLATION FEATURES

FIELD OF THE INVENTION

The present disclosure relates to semiconductor structures and, more particularly, to gate structures and methods of manufacture.

BACKGROUND

High Electron Mobility Transistors (HEMT) utilize a very narrow channel enabling it to operate at exceedingly high frequencies. In addition to the very high frequency performance, the HEMT also offers low noise performance. For these reasons, amongst others, HEMTs have been utilized as Radio Frequency (RF) devices. But it is known that HEMT devices can exhibit gate-drain and gate-source capacitance issues which can affect device performance such as ft and fmax.

SUMMARY

In an aspect of the disclosure, a structure comprises: a gate structure comprising a horizontal portion and a substantially vertical stem portion; and an air gap surrounding the substantially vertical stem portion and having a curved surface under the horizontal portion.

In an aspect of the disclosure, a structure comprises a t-shaped gate structure comprising a horizontal top portion and a substantially vertical stem portion, wherein an underside of the horizontal top portion comprises a curved surface and a junction connecting the substantially vertical stem portion and the horizontal portion comprises another curved surface.

In an aspect of the disclosure, a method comprises: forming a gate structure comprising a horizontal portion and a substantially vertical stem portion; and forming an air gap surrounding the substantially vertical stem portion which comprises a curved surface under the horizontal portion.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to gate structures and methods of manufacture. More specifically, the present disclosure relates to gate structures for High Electron Mobility Transistor (HEMT) devices. It should be recognized that the gate structures can also be MIS-HEMT or any III-IV transistors. In embodiments, the gate structures comprise different air gap isolation features and different gate material configurations forming symmetrical or asymmetrical structures. Advantageously, the air gap isolation features provide increased device performance for the HEMT devices.

In embodiments, the gate structures comprise a t-shaped configuration with a horizontal top surface and a substantially vertical stem portion. In embodiments, the horizontal top surface may have a planar (e.g., flat) upper surface or a curved upper surface (e.g., a convex top surface). The underside of the horizontal top surface may also have a curved surface, e.g., concave portion. An air gap (e.g., cavity) may be provided at the underside of the horizontal top surface and surrounding the substantially vertical stem portion. In embodiments, the air gap may include a curved surface at a junction between the underside of the top surface and the substantially vertical stem portion of the gate structure. Also, the air gap may include an upper curved surface, e.g., having a convex portion.

In further embodiments, the t-shaped gate structure may be a metal gate structure which comprises a channel region with two semiconductor materials having different bandgaps, e.g., forming a HEMT or other device type as noted herein. The t-shaped gate structure may be symmetrical or asymmetrical. For example, in the latter scenario, the t-shaped gate structure may extend laterally further on one side of the vertical stem portion than an opposing side thereof. In this scenario, the air gap may also be asymmetrical. The air gap may also be open or sealed in the active device region, and may be separated from material of the t-shaped gate structure by spacer material.

The gate structures of the present disclosure can be manufactured in a number of ways using a number of different tools. In general, though, the methodologies and tools are used to form structures with dimensions in the micrometer and nanometer scale. The methodologies, i.e., technologies, employed to manufacture the gate structures of the present disclosure have been adopted from integrated circuit (IC) technology. For example, the structures are built on wafers and are realized in films of material patterned by photolithographic processes on the top of a wafer. In particular, the fabrication of the gate structures uses three basic building blocks: (i) deposition of thin films of material on a substrate, (ii) applying a patterned mask on top of the films by photolithographic imaging, and (iii) etching the films selectively to the mask.

Figure 1:
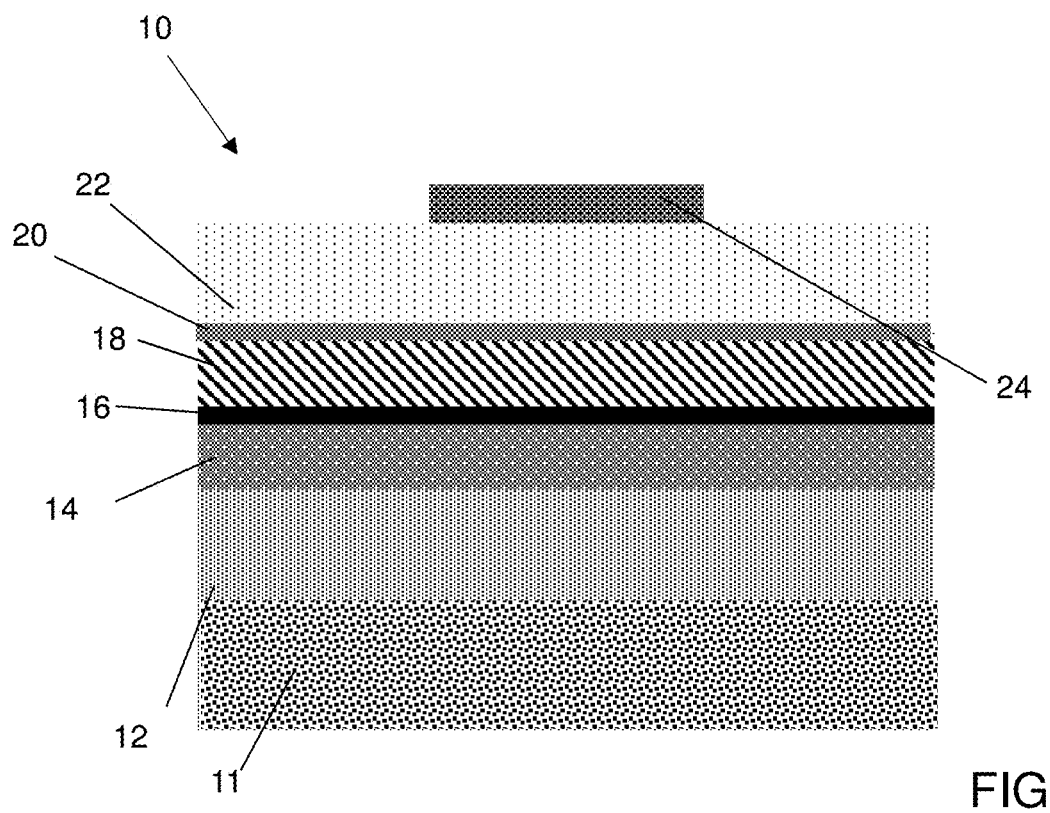
FIG. 1 shows a stack of materials and respective fabrication processes in accordance with aspects of the present disclosure.

FIG. 1 shows a stack of materials and respective fabrication processes in accordance with aspects of the present disclosure. In particular, the structure 10 of FIG. 1 includes a substrate 11 comprising semiconductor material. In embodiments, the substrate 11 may be a handle wafer which has a lattice structure that is compatible with semiconductor material 12. For example, the substrate 11 may be Si or SiC with a constant lattice structure (e.g., 111 orientation in the Si case). The semiconductor material 12 may be a GaN buffer layer used as a bridge between the substrate 11 and the material of a channel region 14. In embodiments, the semiconductor material 12 may be grown using known epitaxial growth processes.

Still referring to FIG. 1, the channel region 14 may be composed of GaN comprising a single crystalline orientation. The material of the channel region 14 may be deposited using conventional epitaxial growth processes to a thickness of about 300 nm; although other dimensions are contemplated herein depending on the specific technology node and design characteristics of the gate structure. An optional pad layer 16 may be deposited on the channel region 14. In embodiments, the optional pad layer 16 may be AlN as one illustrative example.

A barrier material 18 may be formed on the optional pad layer 16. The barrier material 18 may be AlGaN, for example, deposited using a conventional deposition process such as, e.g., Molecular-Beam Epitaxy (MBE). The barrier material 18 may be deposited to a thickness of about 25 nm to 30 nm; although other dimensions are also contemplated herein. A cap layer 20 (e.g., passivation layer) may be formed on the barrier material 18. In embodiments, the cap layer 20 may be a nitride material deposited to a thickness of about 5 nm to 20 nm. An insulator material 22, e.g., $SiO_2$, may be formed on the cap layer 20. In embodiments, the insulator material 22 and the cap layer 20 may be deposited using conventional deposition methods such as, e.g., chemical vapor deposition (CVD) process.

A material 24 may be formed, e.g., deposited, on the insulator material 22. In embodiments, the material 24 may be any material that has an etch selectivity to the insulator material 22 and a subsequently formed gate material. For example, the material 24 may be polysilicon. Also, in embodiments, the thickness of the material 24 will control the upper curved surface as further noted herein. The material 24 may be patterned using conventional lithography and etching processes. For example, a resist formed over the material 24 is exposed to energy (light) to form a pattern (opening). An etching process with a selective chemistry, e.g., reactive ion etching (RIE), will be used to form the pattern of the material 24. The resist can then be removed by a conventional oxygen ashing process or other known stripants.

Figure 2:
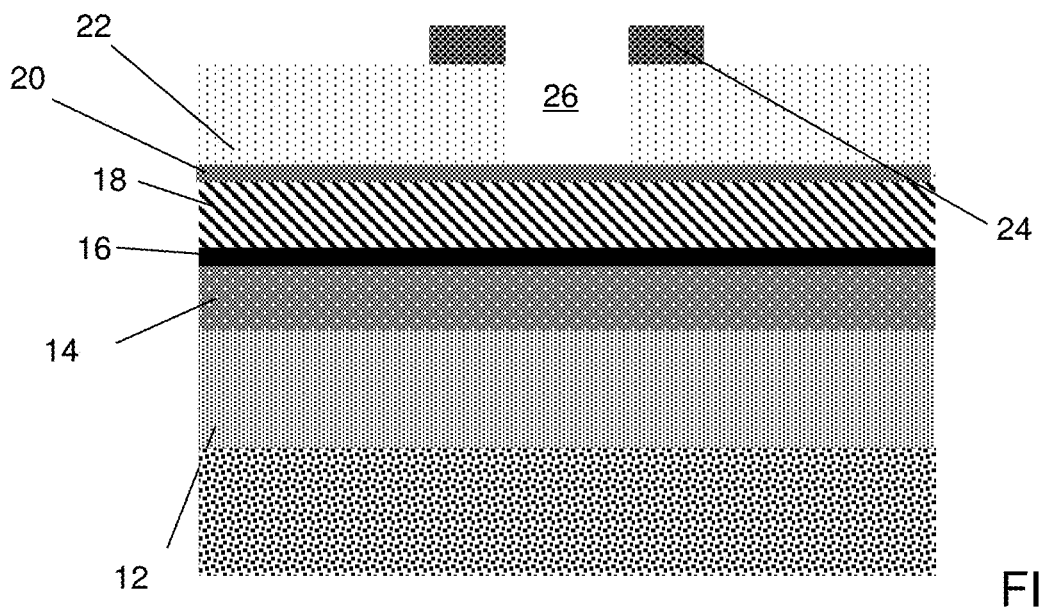
FIG. 2 shows an opening formed in some of the materials of FIG. 1, amongst other features, and respective fabrication processes in accordance with aspects of the present disclosure.
Figure 3:
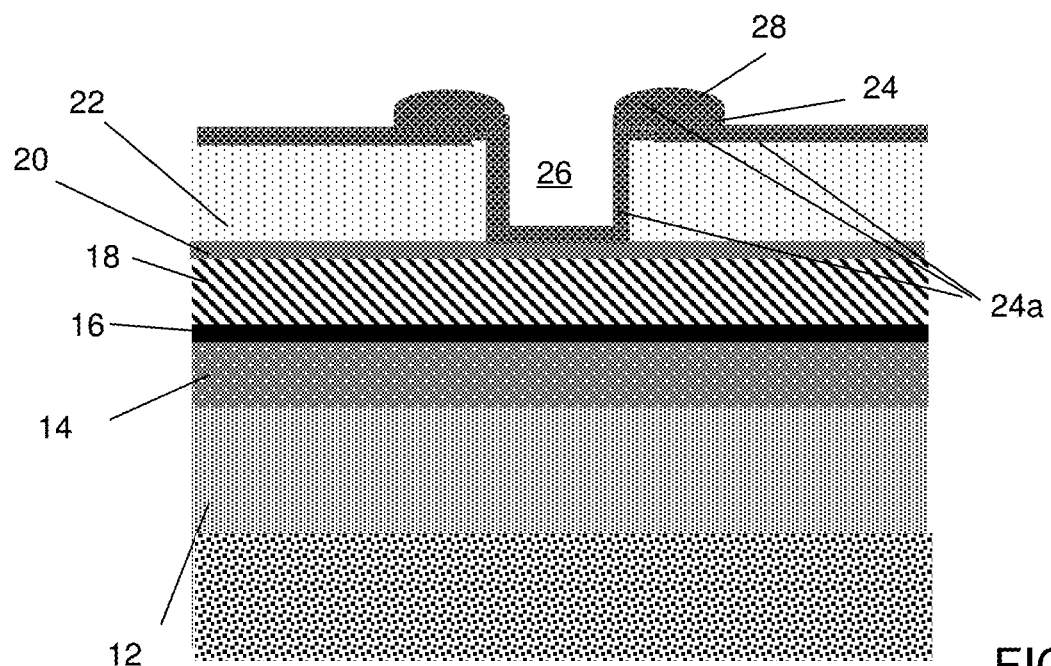
FIG. 3 shows material formed on sidewalls and a bottom surface of the opening, amongst other features, and respective fabrication processes in accordance with aspects of the present disclosure.

In FIG. 2, an opening 26 may be formed through the material 24 and the insulator material 22, stopping on the cap layer 20. In embodiments, the opening 26 may be provided through a center portion of the material 24 or offset towards one side, depending on whether the subsequently formed gate structure is to have a symmetrical air gap or asymmetrical air gap as described in more detail herein. The opening 26 may be formed by conventional lithography and etching processes as already described herein. Also, the opening 26 may have various widths depending on the particular technology node, e.g., about 0.4 µm Referring to FIG. 3, additional material 24a may be formed on sidewalls and a bottom surface of the opening 26. The material 24a may also be formed, e.g., deposited, over the material 24 and on the upper surface of the insulator material 22. In embodiments, the material 24a may be any material that has an etch selectivity to the insulator material 22 and the subsequently formed gate material. For example, the material 24a is preferably the same as the material 24, e.g., polysilicon. Due to the already patterned material 24 on the insulator material 22, the deposition of additional material 24a may form a convex surface 28 at the edges of the opening 26. In embodiments, the material 24a may be deposited to a thickness that will not pinch-off the opening 26, e.g., about 0.1 µm.

Figure 4:
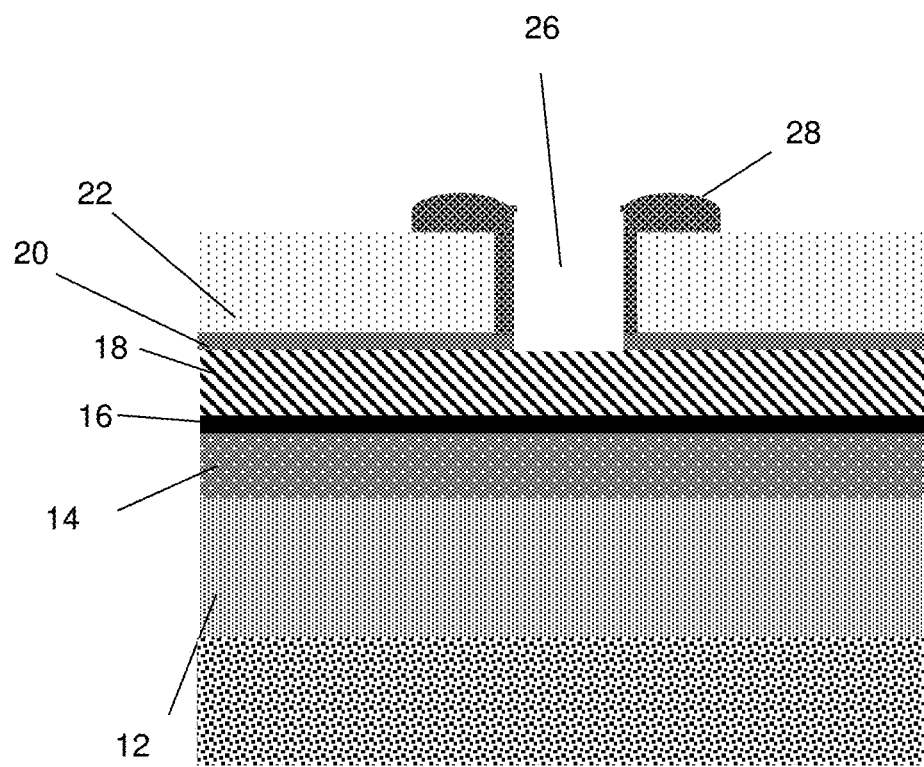
FIG. 4 shows the opening extended to expose barrier material of the stack of materials, amongst other features, and respective fabrication processes in accordance with aspects of the present disclosure.

In FIG. 4, the material 24a may be removed from the bottom surface of the opening 26 and the surface of the insulator material 22. For example, the material 24a may be removed by an anisotropic etching process. As should be understood by those of skill in the art, the anisotropic etching process includes a lateral etching component that etches the material 24a on horizontal surfaces, leaving the material 24a on the sidewalls of the opening 26. Moreover, the convex surface 28 may remain at the edges of the opening 26 due to the thicker material, e.g., combination of material 24, 24a, compared to at the other horizontal surfaces. In embodiments, the material 24a can be removed using a selective etch chemistry of, for example, $XeF_2$ and Tetramethylammonium hydroxide (TMAH). As should be understood by those of skill in the art and in view of the description herein, the shape of the remaining material 24a will dictate the shape of an air gap feature under the subsequently formed gate structure. In case of a HEMT, the exposed cap layer 20 may also be removed by a nitride etch process, exposing the underlying barrier material 18.

Figure 5:
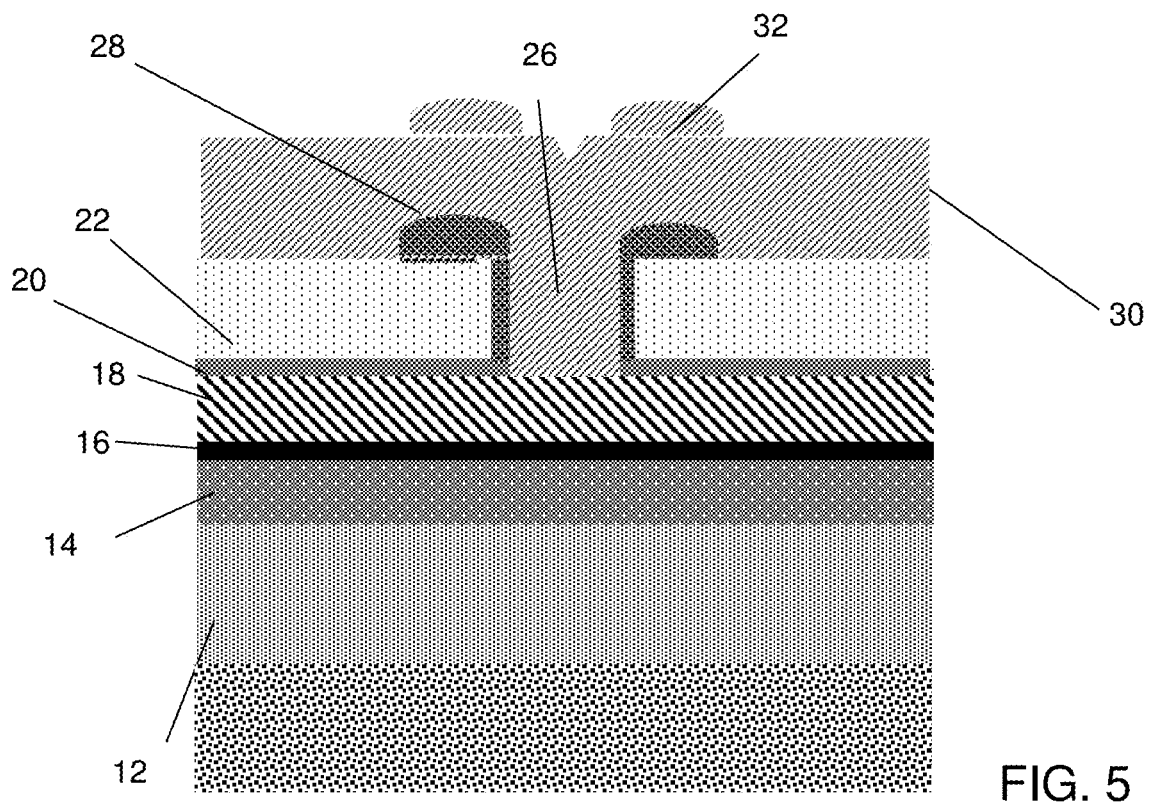
FIG. 5 shows a gate material formed within the opening, amongst other features, and respective fabrication processes in accordance with aspects of the present disclosure.

As further shown in FIG. 5, a gate material 30 may be formed within the opening 26 and in direct contact with the barrier material 18 and patterned material 24a. For example, the gate material 30 may be deposited over the convex surface 28 and the insulator material 22. In embodiments, the gate material 30 may include a convex surface 32 over the convex surface 28. Alternatively, the gate material 30 may have a planar surface over the convex surface 28 which is achieved by performing a planarization process, e.g., chemical mechanical planarization (CMP) process. The gate material 30 may be any appropriate workfunction material including, e.g., Ti, Ta, Al, Tungsten (W), Co or alloys thereof, e.g., TiAlC, TiAl, TaN, TaAlC, TiN, TiC, TaC, HfTi, TiSi, TaSi or TiAlC. The gate material 30 may be deposited using CVD, physical vapor deposition (PVD) including sputtering, atomic layer deposition (ALD) or other suitable methods.

Figure 6B:
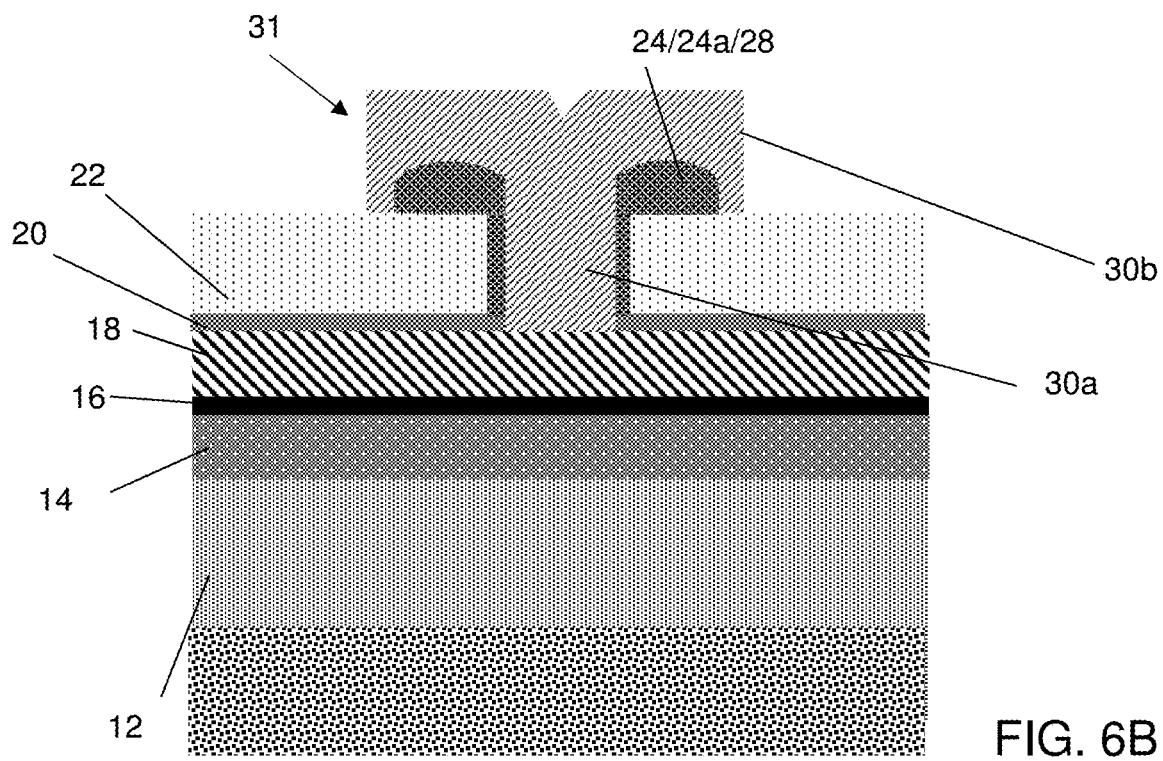
FIG. 6B shows a cross-sectional view of the patterned gate material of FIG. 6A.
Figure 6A:
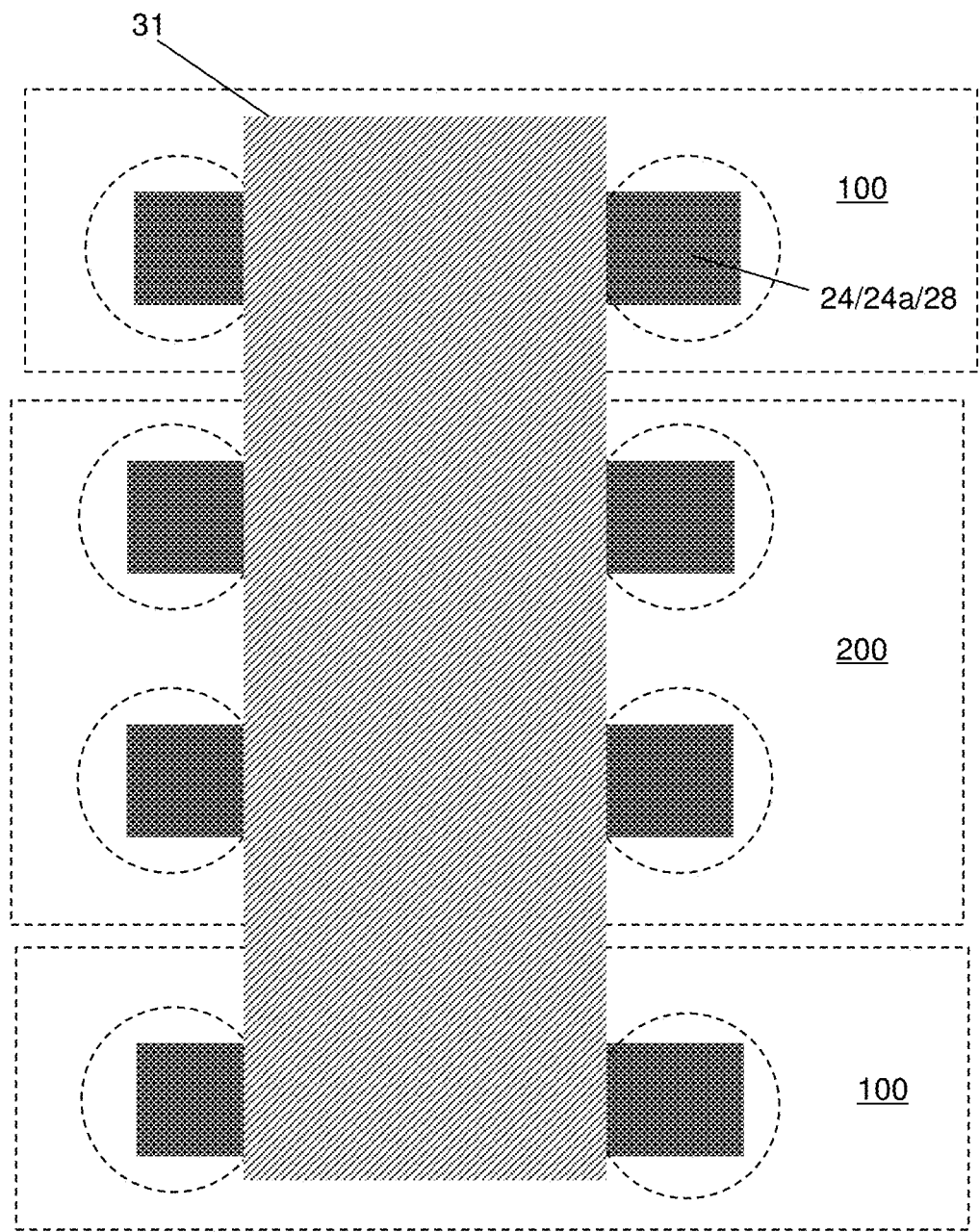
FIG. 6A shows a top view of patterned gate material, amongst other features, and respective fabrication processes in accordance with aspects of the present disclosure.

FIG. 6A shows a top view of a patterned gate structure 31 and FIG. 6B shows a cross-sectional view of the patterned gate structure 31. More specifically, the gate structure 31, which comprises the gate material 30, is patterned into a t-shape structure using conventional lithography and etching processes as described already herein. In this way, the gate structure 31 comprises a substantially vertical stem portion 30a within the opening 26, and a substantially horizontal top surface 30b over the convex surface 28 and the insulator material 22.

Figure 11:
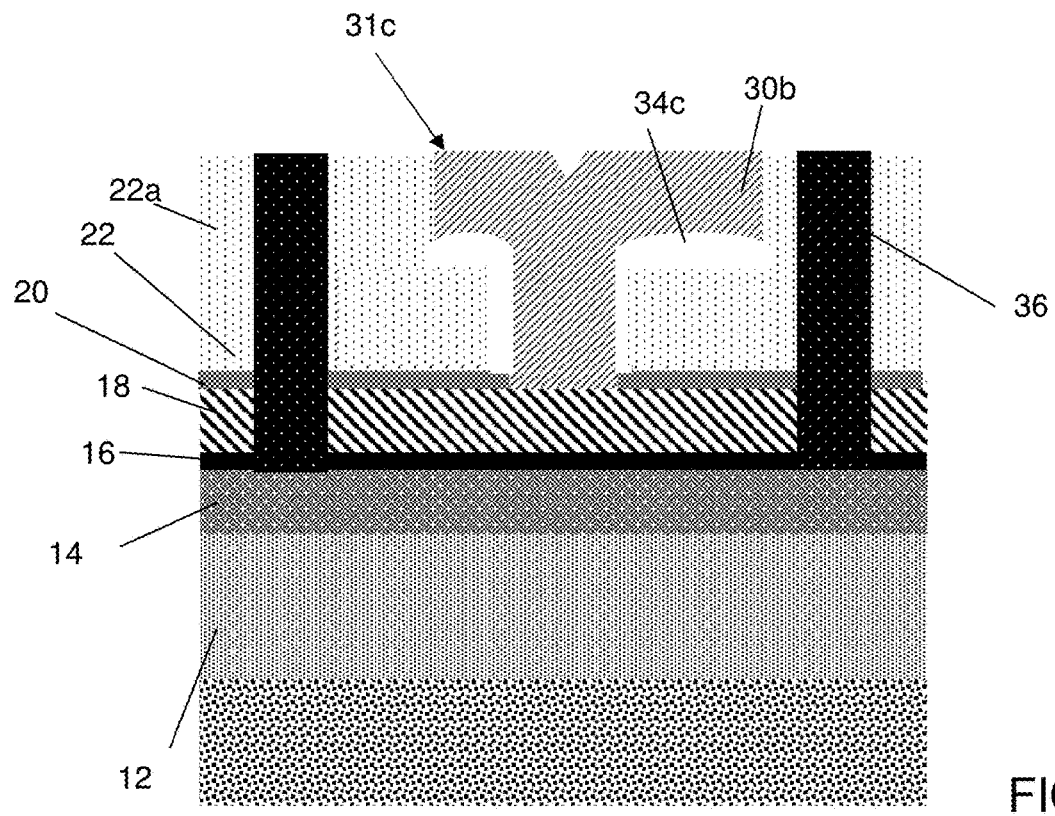

In embodiments, the gate material 30 may be patterned into different configurations including a symmetrical configuration about the opening 26 (to form a symmetrical gate structure) or offset from the opening 26 to form an asymmetrical gate structure (see, e.g., FIG. 11). In addition, the gate material 30 may be patterned to expose portions of the underlying material 24, 24a (to form an open air gap) or to completely cover the material 24 (to form a sealed air gap) in the active device region 200 (shown in FIG. 6A). In any scenario, some of the underlying material 24, 24a may be exposed at access points in non-active device region 100 and/or in the active device regions 200 (as shown by the dashed circles in FIG. 6A).

Figure 7:
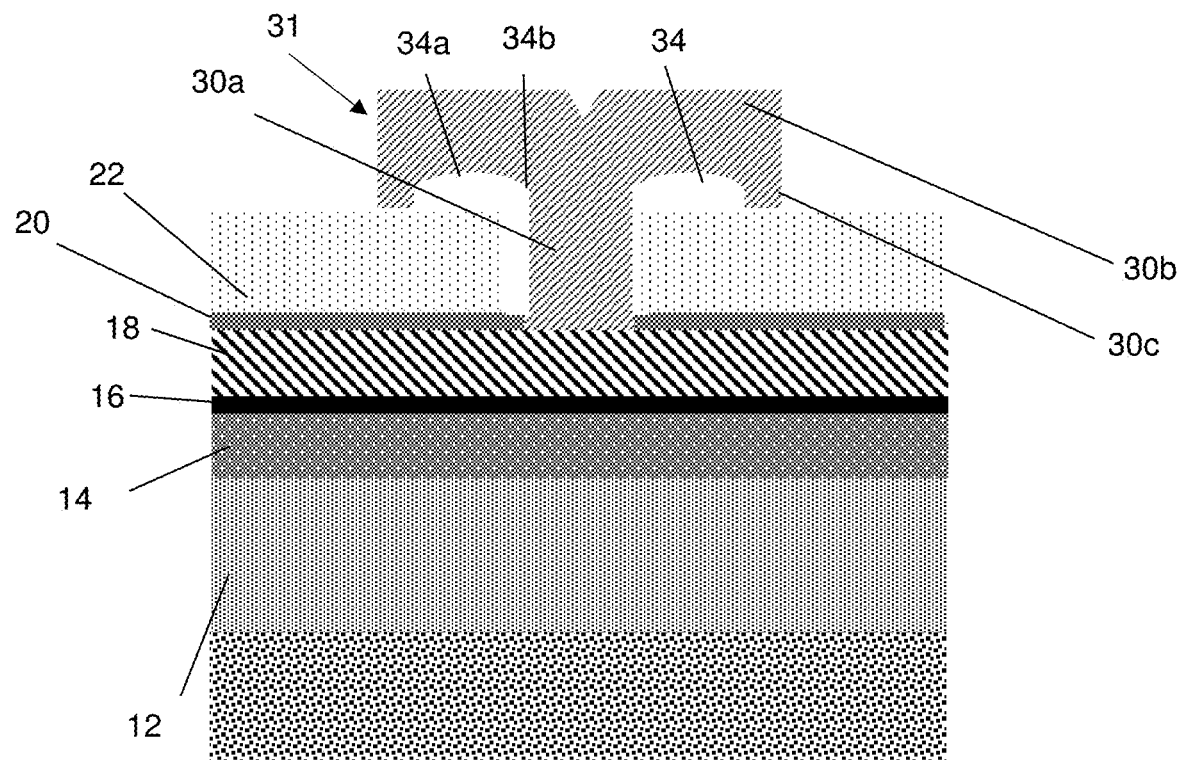
FIG. 7 shows an air gap under the patterned gate material, amongst other features, and respective fabrication processes in accordance with aspects of the present disclosure.

As shown in FIG. 7, the material 24, 24a may be removed through the access points to form an air gap 34 under and around the t-shaped gate structure 31. More specifically, the air gap 34 will be provided at the underside of the horizontal top surface 30b and surrounding the substantially vertical stem portion 30a. In embodiments, the air gap 34 may include an upper curved surface 34a, e.g., having a convex portion, and a curved surface 34b at a junction between the underside of the horizontal top surface 30b and the substantially vertical stem portion 30a. The underside of the horizontal top portion 30b would have a corresponding curved surface, e.g., concave portion, and the junction connecting the substantially vertical stem portion and the horizontal portion would also have a corresponding curved surface, e.g., concave portion.

In the embodiment shown in FIG. 7, the air gap 34 and the t-shaped gate structure 31 are both symmetrical. Also, in this embodiment, the air gap 34 remains sealed by the gate material, e.g., horizontal top surface 30b and extension region 30c. For example, the horizontal top surface 30b extends to the insulator material 22 in the active device region to seal the air gap 34. This extension region 30c may also be used to support the gate structure 31. As to the latter feature, the extension region 30c may prevent collapse of the t-shaped gate structure 31.

Figure 8:
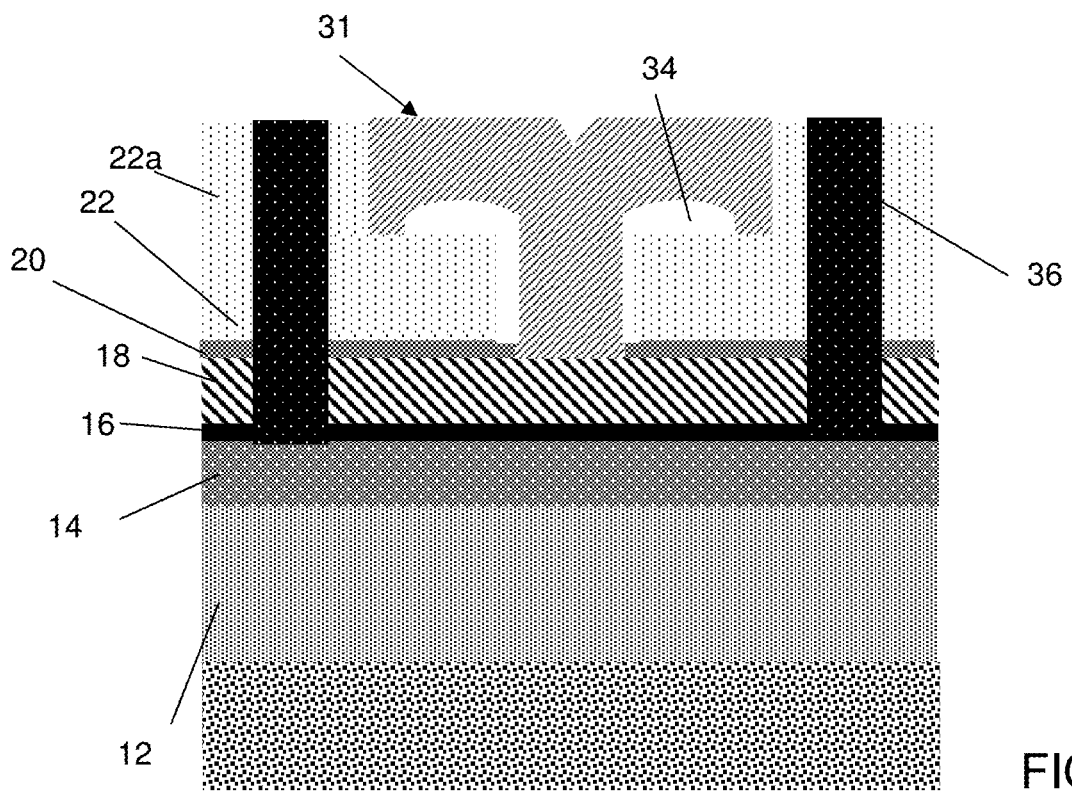
FIG. 8 shows source and drain contacts connecting to a channel region of the gate structure, amongst other features, and respective fabrication processes in accordance with aspects of the present disclosure.

As shown in FIG. 8, source and drain contacts 36 are provided to the material of the channel region 14. In embodiments, the source and drain contacts 36 may be formed by conventional lithography, etching and deposition methods. For example, an insulator material 22a may deposited over the t-shaped gate structure 31, followed by a lithography and etching process to form openings exposing the material of the channel region 14. A metal material may then be deposited within the openings to contact the channel region 14. In embodiments, the metal material may be Al or Ti used to form the source and drain contacts 36. A CMP process may be performed to remove any excessive contact material.

patterning of the horizontal top surface 30b of the t-shaped gate structure 31a, followed by removal of the material 24, 24a.

Figure 10:
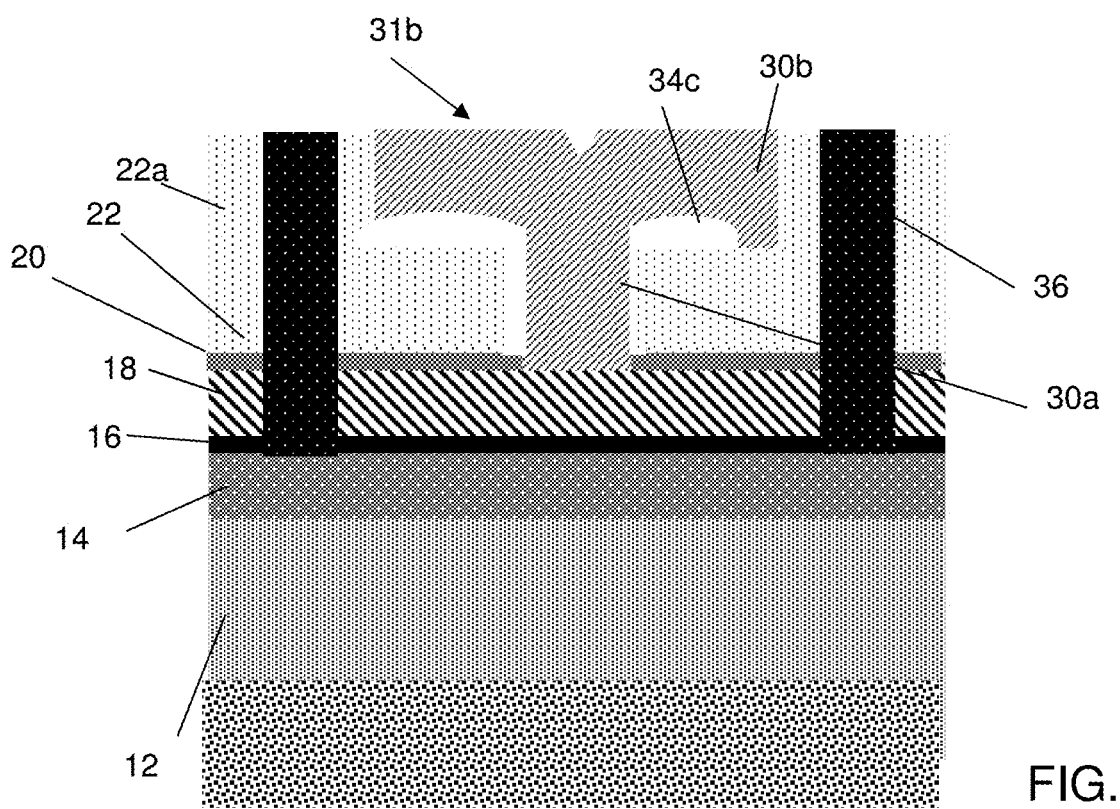

In FIG. 10, the t-shaped gate structure 31b and the air gap 34c are asymmetrical. For example, in this embodiment, both the t-shaped gate structure 31b and the air gap 34c laterally extend further on one side of the substantially vertical stem portion 30a than the other side of the substantially vertical stem portion 30a. In this scenario, the asymmetrical air gap 34c enables optimization of the breakdown voltage, i.e., parasitic capacitances tradeoff for power amplifiers. Moreover, in this embodiment, the asymmetrical air gap 34c may be open on one side and sealed on another side, due to the patterning of the horizontal top surface 30b of the t-shaped gate structure 31b.

In FIG. 11, the t-shaped gate structure 31c and the air gap 34c may also be asymmetrical. In this embodiment, the air gap 34c may be open on both sides, e.g., the horizontal top surface 30b of the t-shaped gate structure 31c does not extend entirely over the air gap 34c in the active device region.

Figure 12:
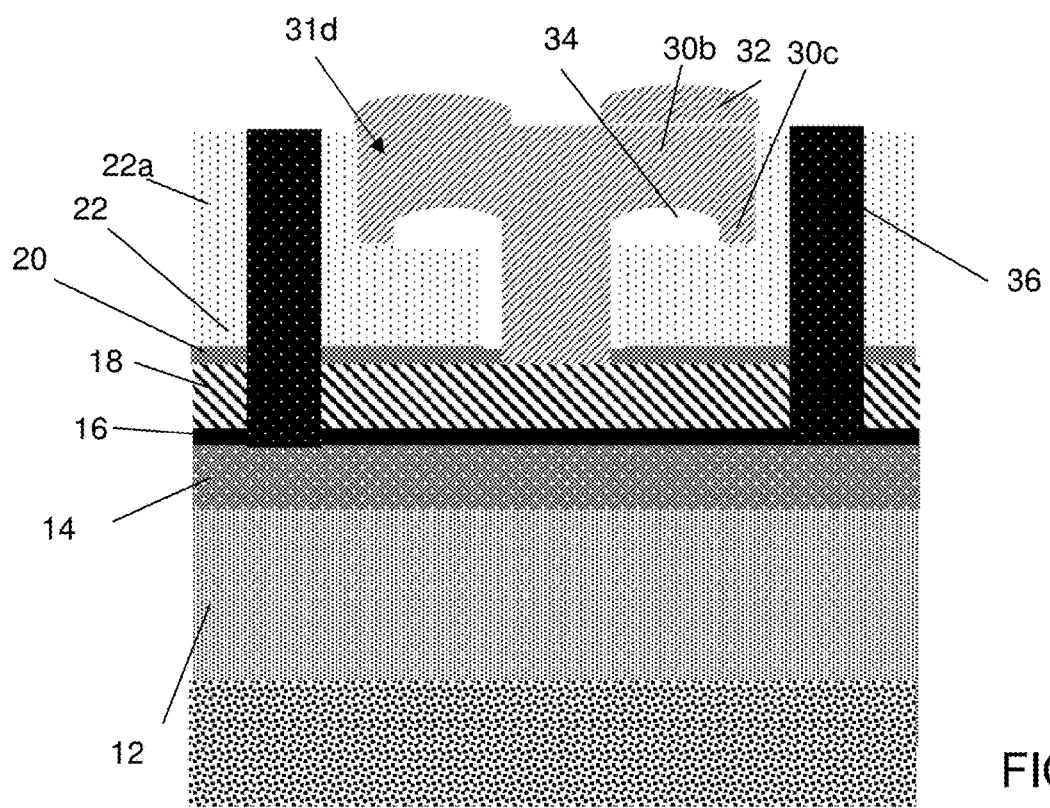

In FIG. 12, the t-shaped gate structure 31d and the air gap 34 may be symmetrical, with the horizontal top surface 30b of the t-shaped gate structure 31b comprising a convex shape 32. Further, the air gap 34 may be sealed on both sides, e.g., with the horizontal top surface 30b and extension region 30c of the t-shaped gate structure 31d.

Figure 13:
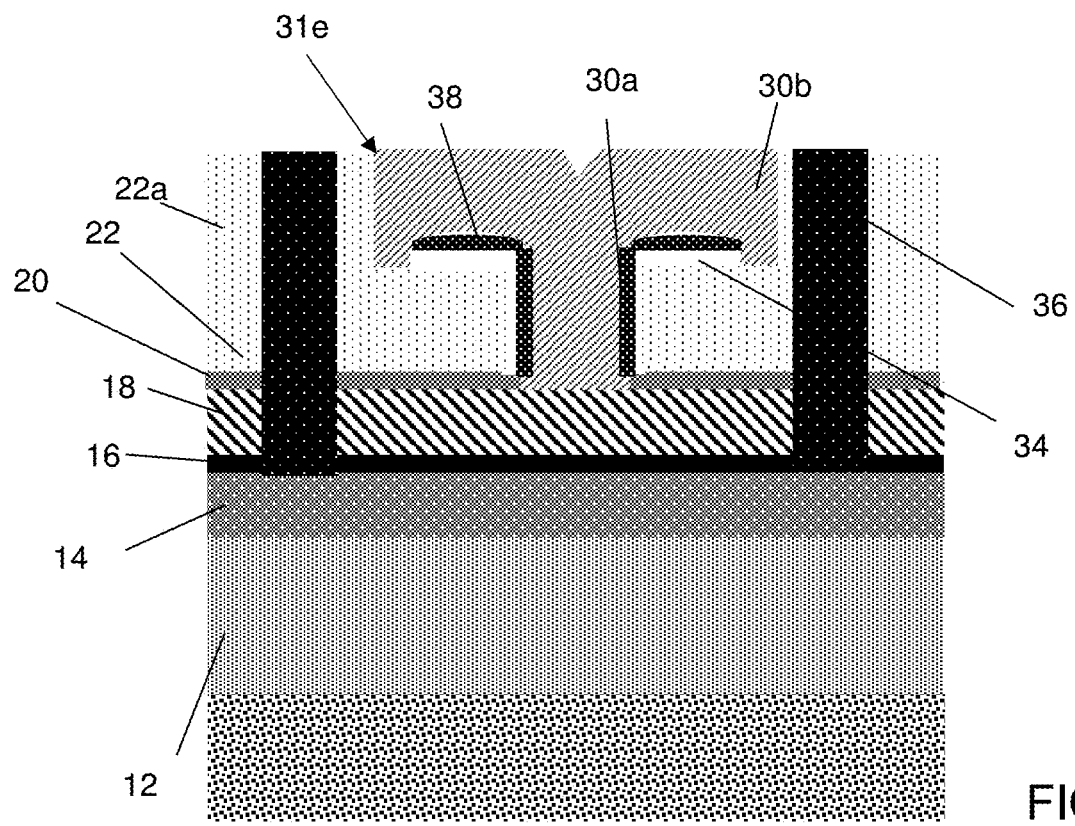

In FIG. 13, the t-shaped gate structure 31e and the air gap 34 may be symmetrical. In this embodiment, the underside of the horizontal top surface 30b and the substantially vertical stem portion 30a of the t-shaped gate structure 31e comprise an oxidation 38, e.g., dielectric spacer material. In this way, the oxidation 38 will serve as a sidewall spacer on the t-shaped gate structure 31e.

Figure 14:
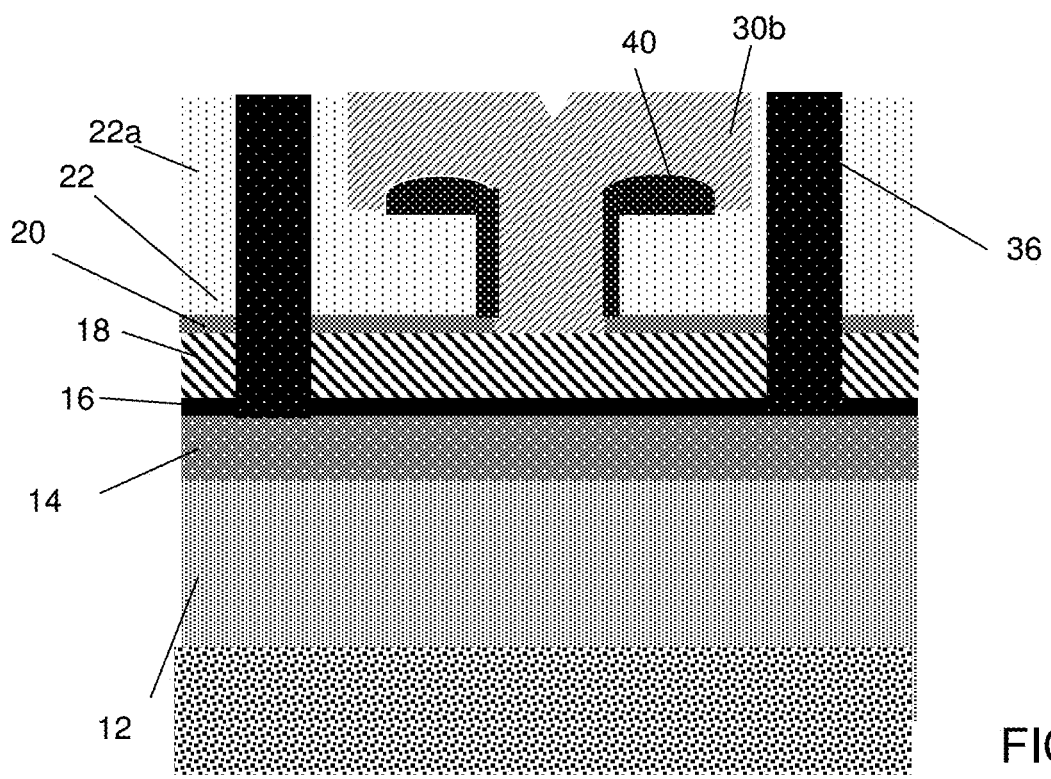

In FIG. 14, the air gap can be fully oxidized as shown at reference numeral 40. In this way, there is no airgap.

Figure 9:
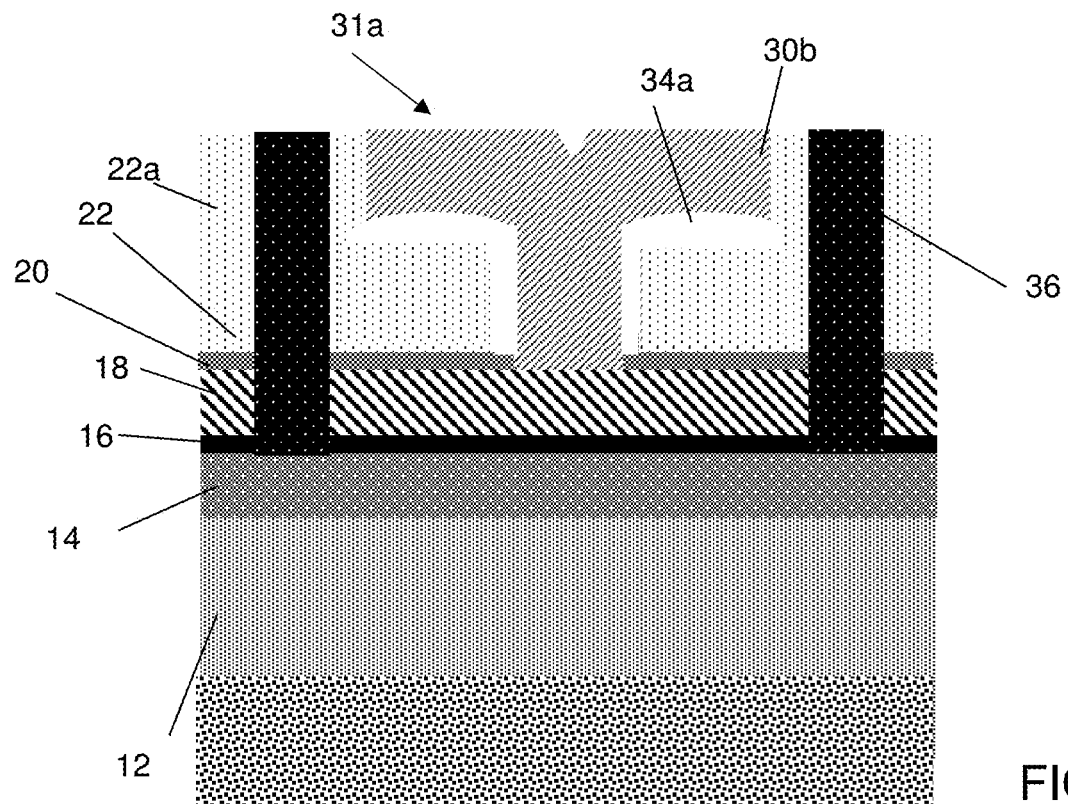
FIGS. 9-14 show various gate structures in accordance with additional aspects of the present disclosure.

Table 1 below shows TCAD simulation results of performance comparisons between a conventional device (e.g., no air gap) and that of a symmetrical device with a closed air gap (FIG. 8) and a symmetrical device with an open air gap (FIG. 9). As shown in Table 1, each of the structures of the present disclosure provides an improvement in Cgd (capacitance of gate to drain), Cgs (capacitance of gate to source), Ft and Fmax, compared to a conventional device with no air gap.

TABLE 1

|  | No air gap | Symmetrical Device with closed airgap | Improvement (%) | Symmetrical Device with open airgap | Improvement (%) |
| --- | --- | --- | --- | --- | --- |
| Cgd [fF/um] | 0.24 | 0.19 | 21 | 0.15 | 37 |
| Cgs [fF/um] | 0.28 | 0.24 | 16 | 0.2 | 29 |
| Ft [GHz] | 56.87 | 64.78 | 14 | 70.67 | 24 |
| Fmax [GHz] | 100 | 122 | 22 | 139 | 39 |

FIGS. 9-14 show various gate structures in accordance with additional aspects of the present disclosure. It should be recognized that any combination of the features of FIGS. 9-14 are also contemplated herein.

In FIG. 9, the horizontal top surface 30b of the t-shaped gate structure 31a does not completely surround the air gap 34a. In this way, the air gap 34a remains open in the active device region. This feature can be provided by exposing the material 24, 24a in the active device region during the The gate structures can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a gate structure comprising a horizontal portion and a substantially vertical stem portion; and
   an air gap surrounding the substantially vertical stem portion and underneath the horizontal portion, the airgap having a convex upper curved surface under the horizontal portion.

2. The structure of claim 1, wherein the curved surface is a convex surface under the horizontal portion of the gate structure.

3. The structure of claim 2, wherein the air gap comprises another curved surface at a junction between the substantially vertical stem portion and the horizontal portion.

4. The structure of claim 1, wherein the gate structure and the air gap are symmetrical.

5. The structure of claim 4, wherein the air gap is sealed in an active device region.

6. The structure of claim 4, wherein the air gap is open at least on one side in an active device region.

7. The structure of claim 1, wherein the horizontal portion comprises a convex upper surface.

8. The structure of claim 1, wherein the gate structure and the air gap are asymmetrical.

9. The structure of claim 1, further comprising an oxidation on an underside surface of the horizontal portion and around the substantially vertical stem portion.

10. The structure of claim 1, wherein the gate structure comprises at least one of a High Electron Mobility Transistor (HEMT), MIS-HEMT and III-IV transistor.

11. A structure comprising a t-shaped gate structure comprising a horizontal top portion and a substantially vertical stem portion, wherein an underside of the horizontal top portion comprises a curved surface and a junction connecting the substantially vertical stem portion and the horizontal portion comprises another curved surface and further comprising an airgap comprising a convex upper surface underneath the horizontal top portion and which also surrounds the substantially vertical stem portion.

12. The structure of claim 11, wherein the curved surface and the another curved surface comprise concave surfaces.

13. The structure of claim 11, wherein the air gap is directly under the horizontal top portion and about the substantially vertical stem portion.

14. The structure of claim 13, wherein the air gap under the horizontal top portion comprises a convex curvature.

15. The structure of claim 13, further comprising a spacer material on sidewalls of the substantially vertical stem portion and underneath the horizontal portion.

16. The structure of claim 13, wherein the air gap is sealed in an active device region.

17. The structure of claim 13, wherein the air gap is asymmetrical about the substantially vertical stem portion.

18. The structure of claim 11, wherein the t-shaped gate structure is symmetrical.

19. The structure of claim 11, wherein the t-shaped gate structure is asymmetrical.

20. A method comprising:
    forming a gate structure comprising a horizontal portion and a substantially vertical stem portion; and
    forming an air gap surrounding the substantially vertical stem portion and underneath the horizontal portion, the airgap under the horizontal portion comprises a convex upper curved surface under the horizontal portion.

* * * * *